(12) United States Patent
Kim et al.

(10) Patent No.: US 11,417,516 B2
(45) Date of Patent: Aug. 16, 2022

(54) DIELECTRIC LAYER AND A SEMICONDUCTOR MEMORY DEVICE INCLUDING THE DIELECTRIC LAYER AS A CAPACITOR DIELECTRIC LAYER

(71) Applicants: KOREA INSTITUTE OF SCIENCE AND TECHNOLOGY, Seoul (KR); INSTITUTE FOR BASIC SCIENCE, Daejeon (KR); ULSAN NATIONAL INSTITUTE OF SCIENCE AND TECHNOLOGY, Ulsan (KR)

(72) Inventors: Seong Keun Kim, Seoul (KR); Woo Chui Lee, Seoul (KR); Sang Tae Kim, Seoul (KR); Hyun Cheol Song, Seoul (KR); Seung Hyub Baek, Seoul (KR); Ji Won Choi, Seoul (KR); Jin Sang Kim, Seoul (KR); Chong Yun Kang, Seoul (KR); Christopher W. Bielawski, Ulsan (KR); Jung Hwan Yum, Ulsan (KR); Eric S. Larsen, Ulsan (KR)

(73) Assignee: Korea Institute of Science and Technology, Seoul (KR)

( * ) Notice: Subject to any disclaimer, the term of this patent is extended or adjusted under 35 U.S.C. 154(b) by 292 days.

(21) Appl. No.: 16/225,432

(22) Filed: Dec. 19, 2018

(65) Prior Publication Data

US 2019/0333858 A1   Oct. 31, 2019

(30) Foreign Application Priority Data

Apr. 25, 2018   (KR) .................. 10-2018-0047915

(51) Int. Cl.
*C01F 3/02*   (2006.01)
*H01L 21/02*   (2006.01)
(Continued)

(52) U.S. Cl.
CPC .......... *H01L 21/02194* (2013.01); *C01F 3/02* (2013.01); *H01L 27/108* (2013.01); *H01L 27/1085* (2013.01); *H01L 28/90* (2013.01)

(58) Field of Classification Search
CPC ..................... H01L 27/108–10897; C01F 3/02
See application file for complete search history.

(56) References Cited

U.S. PATENT DOCUMENTS

2019/0198244 A1* 6/2019 Kim ...................... H01L 28/40

FOREIGN PATENT DOCUMENTS

JP    2002-373945 A    12/2002
KR   10-1999-0080412 A    11/1999
(Continued)

OTHER PUBLICATIONS

Translated Written Search Report for PCT/KR2018/016973 (Year: 2020).*
(Continued)

*Primary Examiner* — Telly D Green
(74) *Attorney, Agent, or Firm* — Rabin & Berdo, P.C.

(57) ABSTRACT

Provided is a dielectric layer that has a rock salt structure in a room temperature stable phase. The dielectric layer is made of a compound having a chemical formula of $Be_xM_{1-x}O$, where M includes one of alkaline earth metals and x has a value greater than 0 and not greater than 0.19. A semiconductor memory device also is provided that includes a capacitor composed of a lower electrode; a dielectric layer disposed on the lower electrode; and an upper electrode disposed on the dielectric layer, wherein the dielectric layer has a rocksalt structure in a room temperature stable phase and is made of a compound having a chemical formula shown below, $$Be_xM_{1-x}O,$$

(Continued)

where M comprises an alkaline earth metal and x has a value greater than 0 and not greater than 0.19.

12 Claims, 7 Drawing Sheets

(51) Int. Cl.
    *H01L 27/108*      (2006.01)
    *H01L 49/02*      (2006.01)

(56) References Cited

FOREIGN PATENT DOCUMENTS

| | | |
|---|---|---|
| KR | 10-2000-0008014 A | 2/2000 |
| KR | 10-2015-0036797 A | 4/2015 |
| KR | 10-2017-0136826 A | 12/2017 |

OTHER PUBLICATIONS

Longxing Su et al., "Wide Range Bandgap Modulation Based on ZnO-based Alloys and Fabrication of Solar Blind UV Detectors with High Reaction Ratio", ACS Applied Materials & Interfaces, 2014, pp. 14152-14158, vol. 6.
Kanghoon Yim et al., "Novel high-K dielectrics for next-generation electronic devices screened by automated ab initio calculations", NPG Asia Materials, 2015, vol. 7.
International Search Report of PCT/KR2018/016973 dated Dec. 31, 2018.

\* cited by examiner

DIELECTRIC LAYER AND A SEMICONDUCTOR MEMORY DEVICE INCLUDING THE DIELECTRIC LAYER AS A CAPACITOR DIELECTRIC LAYER

CROSS-REFERENCE TO RELATED PATENT APPLICATION

This application claims the benefit of Korean Patent Application No. 10-2018-0047915, filed on Apr. 25, 2018, in the Korean Intellectual Property Office, the disclosure of which is incorporated herein in its entirety by reference.

BACKGROUND

1. Field

The present invention relates to a dielectric layer, a semiconductor memory device including the dielectric layer, and methods of manufacturing the dielectric layer and the semiconductor memory device and, more particularly, to a dielectric layer having a high dielectric constant and a large band gap, a semiconductor memory device including the dielectric layer, and methods of manufacturing the dielectric layer and the semiconductor memory device.

2. Description of the Related Art

Currently, integration densities of semiconductor devices exponentially increase along with rapid development of semiconductor industries. Ultra large-scale integration (ULSI) dynamic random-access memory (DRAM) devices with a design rule of a 20-nm level or less are being developed. Development of ULSI DRAM devices with a design rule of a 10-nm level less than the 20-nm level depends on a capacitor having a high capacitance and a low leakage current. In a DRAM device, a capacitor that records data requires at least a certain capacitance regardless of a device size. However, the capacitor is reduced in size to increase an integration density of the device, and the capacitance value proportional to an area is unavoidably reduced due to the reduced capacitor size. As such, to solve this problem, use of a dielectric having a high dielectric constant is required. In addition to a high dielectric constant, the dielectric of the capacitor that stores charges needs to ensure a low leakage current to prevent loss of charges.

Therefore, a dielectric layer having a high dielectric constant to increase an integration density of a DRAM device has been actively developed. For example, silicon oxide ($SiO_2$) or aluminum oxide ($Al_2O_3$) having a dielectric constant equal to or lower than 10 is used in early days, and zirconium oxide ($ZrO_2$) having a dielectric constant of about 40 is currently used. To achieve a higher capacitance, a layer material such as titanium oxide ($TiO_2$) (dielectric constant of about 80) or strontium titanate ($SrTiO_3$) (dielectric constant>100) having a rutile structure is being developed.

A critical factor for determining a leakage current of a dielectric is a band gap of the dielectric layer. A material having a large band gap may generate a high-energy barrier at an interface between an electrode and the dielectric and thus may ensure a low leakage current. However, since a dielectric constant is generally inversely proportional to a band gap, a material having a high dielectric constant has a small band gap. For example, $SiO_2$ having a dielectric constant of 3.9 has a large band gap of about 9 eV and $TiO_2$ or $SrTiO_3$ having a dielectric constant equal to or higher than 80 has a small band gap of about 3 eV. Therefore, when a material having a high dielectric constant is used, an increase in a layer thickness is unavoidable to reduce a leakage current.

As a design rule of 20 nm or less is applied to DRAM devices, a limitation of a layer thickness causes a problem. A rapid reduction in the size of the DRAM devices to 20 nm or less leads to a limitation of a space for a dielectric layer and upper and lower electrodes. Particularly, in a three-dimensional (3D) capacitor having a stack structure, a dielectric layer is limited to a very small thickness of about 5 nm. Such a limitation means that existing methods using a material having a higher dielectric constant are no longer valid and that a material having a large band gap and a low leakage current at a small thickness is required. As such, a high-k material requiring a thickness equal to or greater than 10 nm, e.g., $SrTiO_3$, is no longer usable and a new material capable of ensuring a low leakage current at a thickness of about 5 nm is required.

RELATED ART DOCUMENT

Patent Document (Patent Document 1) KR19990080412A (1999-11-05)

SUMMARY

The present invention provides a dielectric layer capable of ensuring low leakage current characteristics of a capacitor and of increasing a dielectric constant, a semiconductor memory device including the dielectric layer, and methods of manufacturing the dielectric layer and the semiconductor memory device. However, the scope of the present invention is not limited thereto.

According to an aspect of the present invention, there is provided a dielectric layer having a rocksalt structure in a room temperature stable phase and made of a compound having a chemical formula of $Be_xM_{1-x}O$, where M includes one of alkaline earth metals and x has a value greater than 0 and less than 0.5.

In the chemical formula, M may include alkaline earth metal, oxide of which has a rocksalt structure in a room temperature stable phase, e.g., one of magnesium (Mg), calcium (Ca), strontium (Sr), and barium (Ba).

The dielectric layer may include a compound of beryllium oxide (BeO) and alkaline earth metal oxide forming a rocksalt solid solution without phase separation therebetween.

In the chemical formula, x has a value greater than 0 and equal to or less than 0.38, and more specifically, a value equal to or greater than 0.1 and equal to or less than 0.32.

The dielectric layer may be used as a capacitor dielectric layer of a semiconductor memory device.

According to another aspect of the present invention, there is provided a method of manufacturing a dielectric layer, the method including depositing a stack structure of beryllium oxide (BeO) and alkaline earth metal oxide by performing an atomic layer deposition (ALD) process, and obtaining a dielectric layer by performing heat treatment on the stack structure, wherein the dielectric layer has a rocksalt structure in a room temperature stable phase and is made of a compound having a chemical formula of $Be_xM_{1-x}O$, where M includes one of alkaline earth metals and x has a value greater than 0 and less than 0.5.

The ALD process may be performed in a temperature range from room temperature to 350° C., and the heat treatment may be performed in a temperature range from 300° C. to 600° C.

In the chemical formula, M may include alkaline earth metal, oxide of which has a rocksalt structure in a room temperature stable phase, e.g., one of magnesium (Mg), calcium (Ca), strontium (Sr), and barium (Ba).

According to another aspect of the present invention, there is provided a semiconductor memory device including a capacitor including a lower electrode, a dielectric layer on the lower electrode, and an upper electrode on the dielectric layer, wherein the dielectric layer has a rocksalt structure in a room temperature stable phase and is made of a compound having a chemical formula of $Be_xM_{1-x}O$, where M includes one of alkaline earth metals and x has a value greater than 0 and less than 0.5.

In the chemical formula, M may include alkaline earth metal, oxide of which has a rocksalt structure in a room temperature stable phase, e.g., one of magnesium (Mg), calcium (Ca), strontium (Sr), and barium (Ba).

The dielectric layer may include a compound of beryllium oxide (BeO) and alkaline earth metal oxide forming a rocksalt solid solution without phase separation therebetween.

In the chemical formula, x has a value greater than 0 and equal to or less than 0.38, and more specifically, a value equal to or greater than 0.1 and equal to or less than 0.32.

The lower electrode may include an electrode made of one of titanium nitride (TiN), tantalum nitride (TaN), ruthenium (Ru), platinum (Pt), gold (Au), silver (Ag), aluminum (Al), rhodium (Rh), molybdenum (Mo), palladium (Pd), cobalt (Co), copper (Cu), iridium (Ir), tin oxide ($SnO_2$), ruthenium oxide ($RuO_2$), iridium oxide ($IrO_2$), molybdenum oxide ($MoO_2$), and strontium ruthenate ($SrRuO_3$).

According to another aspect of the present invention, there is provided a method of manufacturing a semiconductor memory device, the method including generating a lower electrode, depositing a stack structure of beryllium oxide (BeO) and alkaline earth metal oxide on the lower electrode by performing an atomic layer deposition (ALD) process, generating an upper electrode on the stack structure, and obtaining a dielectric layer by performing heat treatment on the stack structure, wherein the dielectric layer has a rocksalt structure in a room temperature stable phase and is made of a compound having a chemical formula of $Be_xM_{1-x}O$, where M includes one of alkaline earth metals and x has a value greater than 0 and less than 0.5.

The ALD process may be performed in a temperature range from room temperature to 350° C., and the heat treatment may be performed in a temperature range from 300° C. to 600° C.

In the chemical formula, M may include alkaline earth metal, oxide of which has a rocksalt structure in a room temperature stable phase, e.g., one of magnesium (Mg), calcium (Ca), strontium (Sr), and barium (Ba).

BRIEF DESCRIPTION OF THE DRAWINGS

The above and other features and advantages of the present invention will become more apparent by describing in detail embodiments thereof with reference to the attached drawings in which.

DETAILED DESCRIPTION

Figure 1:
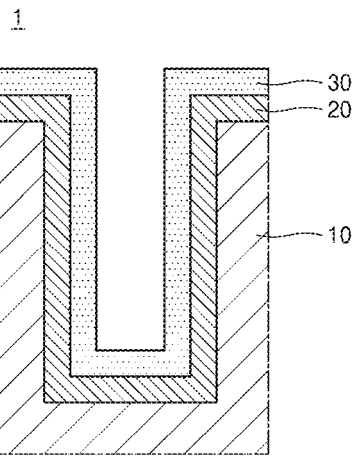
FIG. 1 is a cross-sectional view of a capacitor including a dielectric layer, according to an embodiment of the present invention.

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of at least some elements are exaggerated or reduced for convenience of explanation, and like reference numerals denote like elements.

As used herein, the term "room temperature" refers to the temperature of natural indoor air which is not artificially heated or cooled, and may include, for example, a temperature range from 0° C. to 50° C.

In a rocksalt structure described below, cations and anions may have the same coordination number of 6 and a cation-anion radius ratio may have a range from about 0.414 to about 0.732. In this structure, a unit lattice includes anions aligned in a face-centered cubic (FCC) structure and cations located at the center of the cube and the centers of twelve edges of the cube. It is known that salt (NaCl) is a representative example of the rocksalt structure.

Rocksalt beryllium oxide (BeO) is known as having a high dielectric constant (about 270) and having a large band gap (>10 eV), and thus is regarded as a dielectric layer material of a next-generation dynamic random-access memory (DRAM) capacitor device. Particularly, since a physical thickness of a dielectric layer is severely limited in a 10-nm-level memory device, only a BeO layer is expected to simultaneously ensure a high capacitance and a low leakage current at a small layer thickness. However, unlike that alkaline earth metal oxide such as magnesium oxide (MgO), calcium oxide (CaO), or strontium oxide (SrO) has a rocksalt structure in a stable phase, BeO has a hexagonal wurtzite structure in a room temperature stable phase. In addition, wurtzite BeO has a low dielectric constant (about 8) unlike rocksalt BeO. Therefore, to use a BeO layer for a DRAM capacitor, the BeO layer needs to be controlled to have a rocksalt structure in a stable phase at room temperature.

In a process of generating a BeO-based layer, not only the BeO-based layer needs to be controlled to have a rocksalt structure but also a rocksalt-structure high-k dielectric layer generation process needs to be friendly to a DRAM process. Particularly, an aspect ratio of a three-dimensional (3D) capacitor of a 10-nm-level DRAM device is predicted to exceed 100, and a process capable of generating a uniform-thickness layer in the 3D capacitor is essential. In addition, since the process of generating the BeO-based layer and controlling the structure thereof is limited to a temperature of about 500° C. to about 600° C. to prevent degradation of, for example, a transistor at a front-end, the layer should be generated and the structure thereof should be controlled at a process temperature equal to or lower than 600° C.

To satisfy the above requirements, according to the present invention, a layer of a compound of BeO and another oxide is generated for stabilization of a rocksalt structure in an atomic layer deposition (ALD) process temperature range. In this case, the other oxide may include alkaline earth metal oxide having a rocksalt structure in a stable phase, e.g., MgO, CaO, SrO, or barium oxide (BaO), but is not limited thereto. The compound of BeO and the other oxide is used as a dielectric of a DRAM capacitor, and an ALD process having excellent step coverage characteristics is performed to generate a uniform layer on a 3D capacitor of a DRAM device.

Specifically, a dielectric layer according to an embodiment of the present invention has a rocksalt structure in a room temperature stable phase and is made of a compound having a chemical formula of $Be_xM_{1-x}O$, where M includes one of alkaline earth metals and x has a value greater than 0 and less than 0.5. In the chemical formula, M may include alkaline earth metal, oxide of which has a rocksalt structure in a room temperature stable phase, e.g., one of magnesium (Mg), calcium (Ca), strontium (Sr), and barium (Ba). The dielectric layer may include a compound of BeO and the alkaline earth metal oxide forming a rocksalt solid solution without phase separation therebetween. In the chemical formula of the dielectric layer, x may have a value greater than 0 and equal to or less than 0.38, and more specifically, a value equal to or greater than 0.1 and equal to or less than 0.32. The dielectric layer may be used as a capacitor dielectric layer of a semiconductor memory device.

A method of manufacturing a dielectric layer, according to an embodiment of the present invention, includes depositing a stack structure of BeO and alkaline earth metal oxide by performing an ALD process, and obtaining a dielectric layer by performing heat treatment on the stack structure, wherein the dielectric layer has a rocksalt structure in a room temperature stable phase and is made of a compound having a chemical formula of $Be_xM_{1-x}O$, where M includes one of alkaline earth metals and x has a value greater than 0 and less than 0.5. The ALD process may be performed in a temperature range from room temperature to 350° C., and the heat treatment may be performed in a temperature range from 300° C. to 600° C. In the chemical formula, M may include alkaline earth metal, oxide of which has a rocksalt structure in a room temperature stable phase, e.g., one of Mg, Ca, Sr, and Ba.

Referring to FIG. 1, a semiconductor memory device according to another embodiment of the present invention includes a capacitor 1 including a lower electrode 10, a dielectric layer 20 on the lower electrode 10, and an upper electrode 30 on the dielectric layer 20. The dielectric layer 20 has a rocksalt structure in a room temperature stable phase and is made of a compound having a chemical formula of $Be_xM_{1-x}O$, where M includes one of alkaline earth metals and x has a value greater than 0 and less than 0.5. In the chemical formula, M may include alkaline earth metal, oxide of which has a rocksalt structure in a room temperature stable phase, e.g., one of Mg, Ca, Sr, and Ba. The dielectric layer 20 may include a compound of BeO and the alkaline earth metal oxide forming a rocksalt solid solution without phase separation therebetween. In the chemical formula of the semiconductor memory device, x may have a value greater than 0 and equal to or less than 0.38, and more specifically, a value equal to or greater than 0.1 and equal to or less than 0.32. The lower electrode 10 may include an electrode made of one of titanium nitride (TiN), tantalum nitride (TaN), ruthenium (Ru), platinum (Pt), gold (Au), silver (Ag), aluminum (Al), rhodium (Rh), molybdenum (Mo), palladium (Pd), cobalt (Co), copper (Cu), iridium (Ir), tin oxide ($SnO_2$), ruthenium oxide ($RuO_2$), iridium oxide ($IrO_2$), molybdenum oxide ($MoO_2$), and strontium ruthenate ($SrRuO_3$).

A method of manufacturing a semiconductor memory device, according to another embodiment of the present invention, includes generating a lower electrode, depositing a stack structure of BeO and alkaline earth metal oxide on the lower electrode by performing an ALD process, generating an upper electrode on the stack structure, and obtaining a dielectric layer by performing heat treatment on the stack structure, wherein the dielectric layer has a rocksalt structure in a room temperature stable phase and is made of a compound having a chemical formula of $Be_xM_{1-x}O$, where M includes one of alkaline earth metals and x has a value greater than 0 and less than 0.5. The ALD process may be performed in a temperature range from room temperature to 350° C., and the heat treatment may be performed in a temperature range from 300° C. to 600° C. In the chemical formula, M may include alkaline earth metal, oxide of which has a rocksalt structure in a room temperature stable phase, e.g., one of Mg, Ca, Sr, and Ba.

A dielectric layer, a semiconductor memory device including the dielectric layer, and methods of manufacturing the dielectric layer and the semiconductor memory device, according to embodiments of the present invention, will now be described in detail.

The present invention provides a complex oxide dielectric layer including rocksalt BeO usable as a capacitor dielectric layer material of a next-generation memory semiconductor device, and a method of manufacturing the same. The present invention also provides a memory semiconductor device including a capacitor including a lower electrode, a complex oxide dielectric layer on the lower electrode, and an upper electrode on the dielectric layer, and a method of manufacturing the same.

Particularly, in the present invention, the dielectric layer includes a compound of BeO and alkaline earth metal oxide having a rocksalt structure in a stable phase, e.g., MgO, CaO, SrO, or BaO, for stabilization of a rocksalt structure.

For convenience of explanation, in the following description, the alkaline earth metal oxide is assumed as MgO and a $Be_xMg_{1-x}O$ (0≤x≤1) layer is generated as a dielectric layer to measure characteristics thereof. A lower electrode is generated using TiN that is an electrode material of a commercialized DRAM capacitor, and the $Be_xMg_{1-x}O$ layer is generated by performing an ALD process.

In an embodiment of the present invention, $Be(CH_3)_2$ is used as a reaction source material of Be and $Mg(EtCp)_2$ is used as a reaction source material of Mg. $H_2O$ is used as an oxygen source material. A composition ratio of the $Be_xMg_{1-x}O$ layer is adjusted by controlling a MgO—BeO cycle ratio in the ALD process.

In the present invention, the reaction source material of Be may include one of $Be(CH_3)_2$, $Be(C_2H_5)_2$, di-tert-butyl beryllium, and $Be(acac)_2$ and the reaction source material of Mg may include one of $Mg(EtCp)_2$, $Mg(Cp)_2$, and $Mg(thd)_2$. However, the reaction source materials are not limited thereto. The oxygen source material may include one or more selected from among water, oxygen gas, air, mixture gas of nitrogen and oxygen, methanol, ethanol, isopropanol, ozone, hydrogen peroxide, and oxygen plasma.

In an embodiment of the present invention, a stack structure of BeO and alkaline earth metal oxide may be deposited on a base layer by performing an ALD process, and then a dielectric layer may be obtained by performing heat treatment on the stack structure. Herein, BeO may be ALD-deposited by performing at least one cycle sequentially including providing a reaction source material of Be (e.g., $Be(CH_3)_2$) onto the base layer and adsorbing at least a part of the reaction source material of Be on the base layer, purging the remaining non-adsorbed reaction source material of Be, providing an oxygen source material (e.g., $H_2O$) onto the base layer having the reaction source material of Be adsorbed thereon and generating a unit deposition layer of BeO on the base layer due to reaction between the oxygen source material and the reaction source material of Be, and purging the remaining non-reacted oxygen source material.

The alkaline earth metal oxide may be ALD-deposited by performing at least one cycle sequentially including providing a reaction source material of alkaline earth metal (e.g., $Mg(EtCp)_2$) onto the base layer and adsorbing at least a part of the reaction source material of the alkaline earth metal on the base layer, purging the remaining non-adsorbed reaction source material of the alkaline earth metal, providing an oxygen source material (e.g., $H_2O$) onto the base layer having the reaction source material of the alkaline earth metal adsorbed thereon and generating a unit deposition layer of the alkaline earth metal oxide on the base layer due to reaction between the oxygen source material and the reaction source material of the alkaline earth metal, and purging the remaining non-reacted oxygen source material.

In an embodiment of the present invention, a $Be_xMg_{1-x}O$ layer may be generated in a deposition temperature range from room temperature to 350° C. but is not limited thereto. Furthermore, in an embodiment of the present invention, a TiN substrate is used as a lower electrode, and an electrode-dielectric-electrode capacitor is produced by generating an upper electrode on the $Be_xMg_{1-x}O$ layer. After the upper electrode is generated, heat treatment is performed at 400° C. for 30 minutes. The heat treatment is not limited to the temperature of 400° C. and may be performed in a temperature range from 300° C. to 600° C.

In the present invention, the substrate may include one of TiN, TaN, Ru, Pt, Au, Ag, Al, Rh, Mo, Pd, Co, Cu, Ir, $SnO_2$, $RuO_2$, $IrO_2$, $MoO_2$, and $SrRuO_3$ but is not limited thereto.

In an embodiment of the present invention, the $Be_xMg_{1-x}O$ layer may have a thickness less than 10 nm. More specifically, for applicability to a DRAM capacitor, a $Be_xMg_{1-x}O$ layer having a thickness less than 6 nm may be used.

Composition ratios, crystal structures, lattice constants, band gaps, dielectric constants, etc. of various dielectric layers according to test examples of the present invention will now be described in detail.

Figure 2:
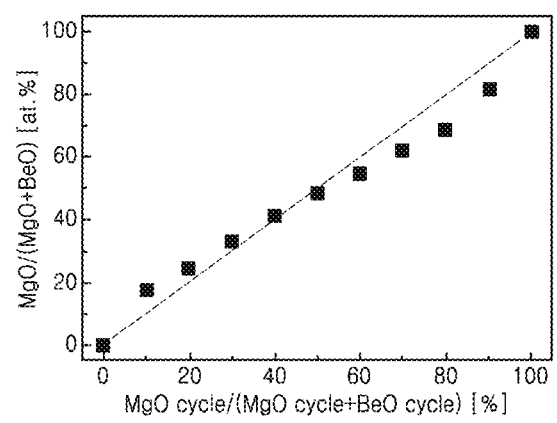
FIG. 2 is a graph showing composition ratios of a $Be_xMg_{1-x}O$ layer based on a magnesium oxide (MgO)-beryllium oxide (BeO) cycle ratio in an atomic layer deposition (ALD) process of a method of manufacturing a dielectric layer, according to test examples of the present invention.

FIG. 2 and Table 1 are a graph and a table showing variations in a composition ratio of a $Be_xMg_{1-x}O$ layer based on a MgO—BeO cycle ratio in an ALD process of a method of manufacturing a dielectric layer, according to test examples of the present invention.

TABLE 1

| MgO cycles/(MgO cycles + BeO cycles) [%] | MgO/(MgO + BeO)[at. %] |
|---|---|
| 0 | 0 |
| 10 | 17.58009 |
| 20 | 24.48273 |
| 30 | 33.15265 |
| 40 | 41.39726 |
| 50 | 48.48047 |
| 60 | 54.76649 |
| 70 | 62.08071 |
| 80 | 68.69637 |
| 90 | 81.55212 |
| 100 | 100 |

The MgO—BeO cycle ratio in the ALD process is calculated as [MgO ALD cycles]/[BeO ALD cycles+MgO ALD cycles] [%]. The composition ratio is calculated by measuring area ratios and relative sensitivity factors (RSFs) of elements based on x-ray photoelectron spectroscopy (XPS). It is shown that the composition ratio of the $Be_xMg_{1-x}O$ layer in an entire range of the MgO—BeO cycle ratio from 0% to 100% is well controlled based on a pulse cycle ratio.

Figure 3:
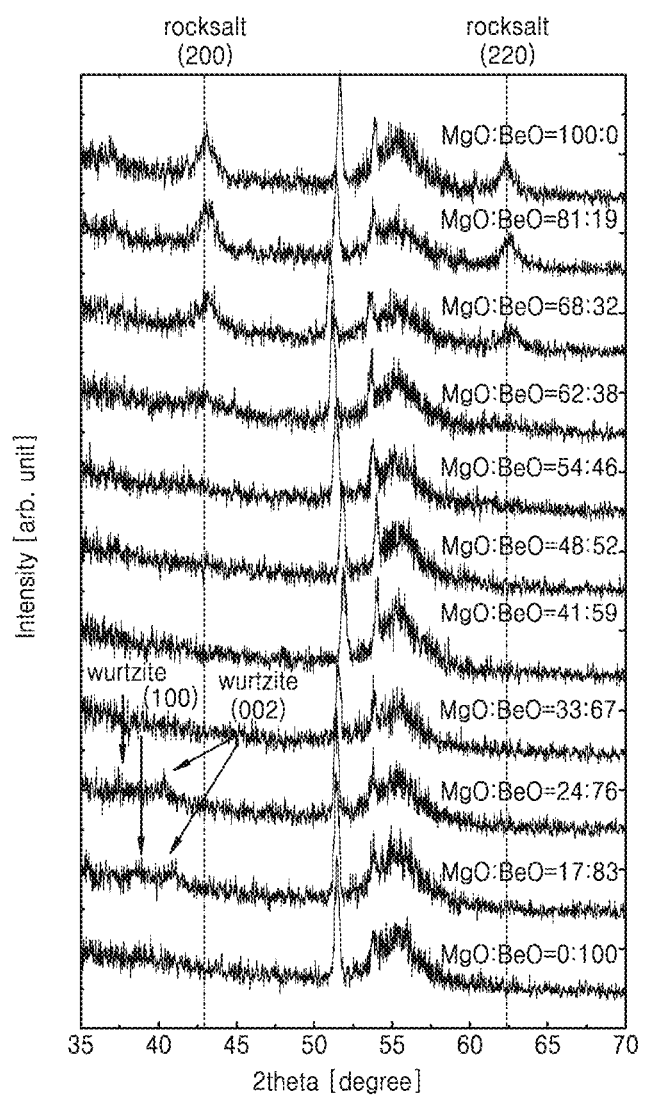
FIG. 3 is a graph showing x-ray diffraction patterns based on variations in a composition ratio of a $Be_xMg_{1-x}O$ layer used as a dielectric layer, according to test examples of the present invention.

FIG. 3 is a graph showing x-ray diffraction patterns based on composition ratios of a $Be_xMg_{1-x}O$ layer used as a dielectric layer, according to test examples of the present invention. As described above in relation to FIG. 2, the composition ratio of the $Be_xMg_{1-x}O$ layer may be changed by controlling MgO and BeO cycles in an ALD process. In FIG. 3, rocksalt (200) and (220) peaks are dominantly observed in a composition ratio range of MgO from about 54 at. % to 100 at. % in the $Be_xMg_{1-x}O$ layer. This shows that the $Be_xMg_{1-x}O$ layer has a rocksalt structure in the composition ratio range. On the other hand, wurtzite peaks are observed in a high composition ratio range of BeO from 76 at. % to 83 at. %, and this shows that the layer is crystallized to a wurtzite structure when the composition ratio of BeO is increased.

Referring to the results of FIG. 3, it is shown that a dielectric layer according to an embodiment of the present invention is made of a compound having a chemical formula of $Be_xMg_{1-x}O$ and has a rocksalt structure in a room temperature stable phase when x has a value greater than 0 and less than 0.5.

Figure 4:
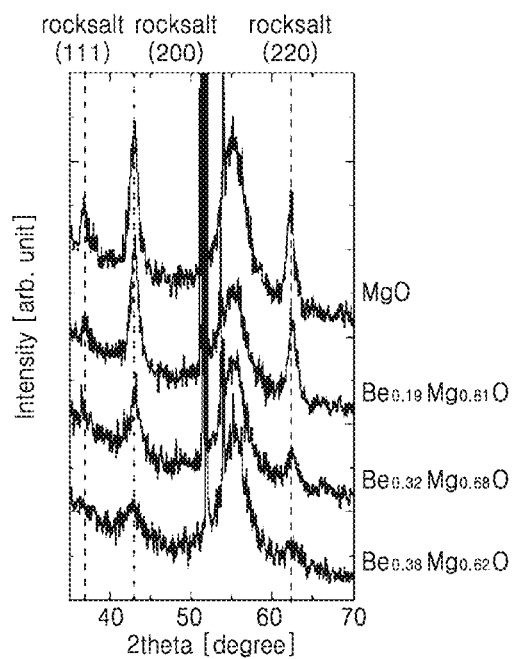
FIG. 4 is a graph showing x-ray diffraction patterns based on variations in a composition ratio (x) of BeO in a $Be_xMg_{1-x}O$ layer used as a dielectric layer, from 0 at. % to 38 at. %, according to test examples of the present invention.

FIG. 4 is a graph showing x-ray diffraction patterns based on variations in a composition ratio of a $Be_xMg_{1-x}O$ layer in a range of a composition ratio (x) of BeO from 0 at. % to 38 at. % where rocksalt peaks are dominantly observed in FIG. 3. To more clearly observe structural variations of a rocksalt structure having a high dielectric constant, x-ray diffraction patterns in the composition ratio range are specifically shown. Rocksalt MgO (200) and (220) peaks move rightward from 42.948° and 62.360° as BeO is added. It may be understood that such peak variations occur because a lattice constant of rocksalt BeO, e.g., 0.3630 nm, is lower than a lattice constant of rocksalt MgO, e.g., 0.4212 nm, and thus an interplanar spacing is reduced as BeO is added.

Figure 5:
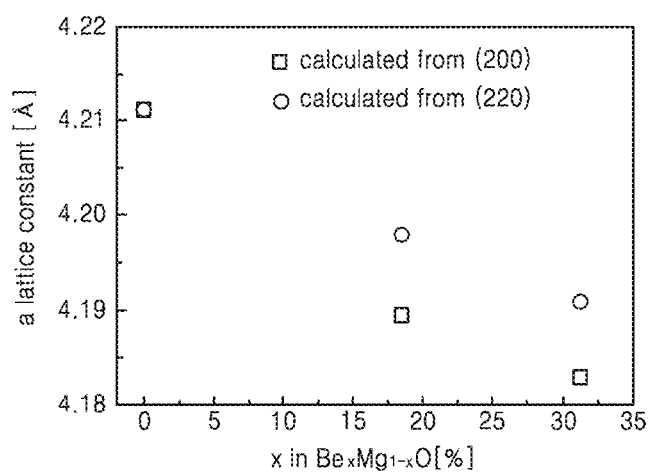
FIG. 5 is a graph showing variations in a lattice constant of a rocksalt structure based on a composition ratio of a $Be_xMg_{1-x}O$ layer used as a dielectric layer, according to test examples of the present invention.

FIG. 5 and Table 2 are a graph and a table showing variations in a lattice constant based on variations in a composition ratio of a $Be_xMg_{1-x}O$ layer used as a dielectric layer and having a composition ratio (x) of BeO from 0 at. % to 38 at. % in FIG. 4, according to test examples of the present invention.

TABLE 2

| x in $Be_xMg_{1-x}O$ [%] | a lattice constant [Å] (200) | a lattice constant [Å] (220) |
|---|---|---|
| 0 | 4.2112 | 4.2112 |
| 18.44 | 4.1895 | 4.198 |
| 31.3 | 4.183 | 4.191 |

In $Be_xMg_{1-x}O$, pure MgO has a lattice constant of 0.42112 nm and the lattice constant is reduced as BeO is added. For example, $Be_{0.18}Mg_{0.82}O$ has a lattice constant of 0.41895 nm to 0.4198 nm, $Be_{0.31}Mg_{0.69}O$ has a lattice constant of 0.4183 nm to 0.4191 nm, and $Be_{0.38}Mg_{0.62}O$ has a lattice constant of 0.4182 nm. Since the lattice constant reduction effect may not be achieved when phase separation into BeO and MgO occurs in the $Be_xMg_{1-x}O$ layer, the variations in the lattice constant based on the variations in the composition ratio show that the $Be_xMg_{1-x}O$ layer forms a solid solution and has a cubic rocksalt structure in a range of the BeO composition ratio (x) from 0 at. % to 38 at. %.

Referring to the results of FIGS. 4 and 5, it is shown that a dielectric layer according to an embodiment of the present invention is made of a compound having a chemical formula of $Be_xMg_{1-x}O$ and that the $Be_xMg_{1-x}O$ layer forms a solid solution and has a cubic rocksalt structure without phase separation between BeO and alkaline earth metal oxide when x has a value greater than 0 and equal to or less than 0.38.

Figure 6:
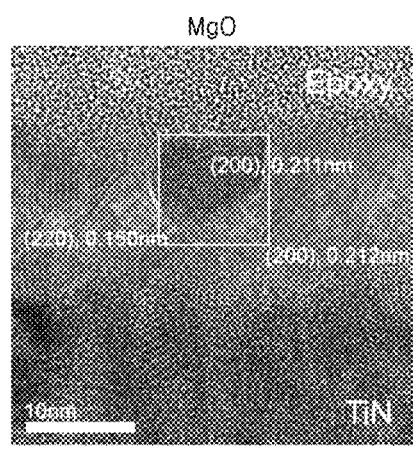
FIGS. 6 to 9 are high-resolution transmission electron microscope (HRTEM) images of MgO, $Be_{0.19}Mg_{0.81}O$, $Be_{0.52}Mg_{0.48}O$, and BeO layers generated by performing an ALD process of a method of manufacturing a dielectric layer, according to test examples of the present invention.
Figure 7:
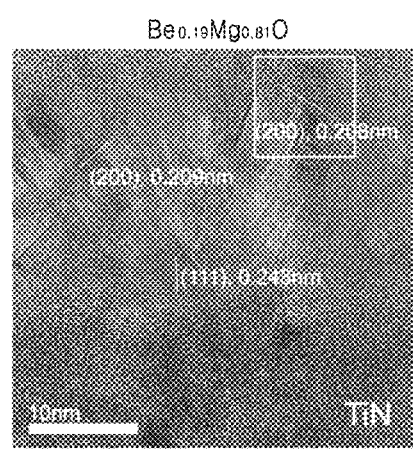
Figure 8:
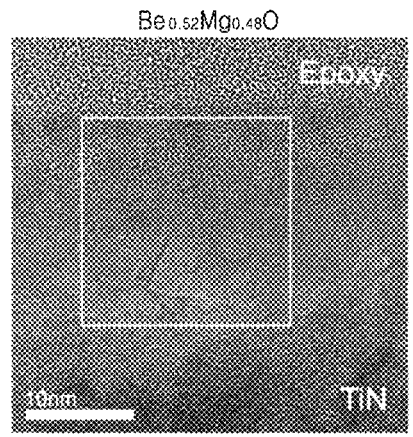
Figure 9:
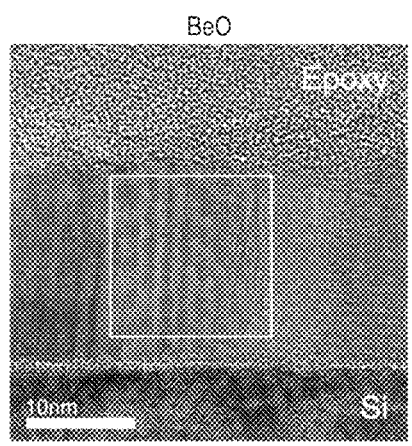

FIGS. 6 to 9 are high-resolution transmission electron microscope (HRTEM) images of MgO, $Be_{0.19}Mg_{0.81}O$, $Be_{0.52}Mg_{0.48}O$, and BeO layers generated by performing an ALD process of a method of manufacturing a dielectric layer, according to test examples of the present invention. Referring to FIG. 6, it is shown that the MgO layer generated on a TiN substrate has a rocksalt structure. An average interplanar spacing of a rocksalt MgO (200) plane is measured to be 0.211 nm to 0.212 nm. Referring to FIG. 7, it is shown that the $Be_{0.19}Mg_{0.81}O$ layer generated on a TiN substrate also has a rocksalt structure and that an average interplanar spacing of a (200) plane is 0.208 nm to 0.209 nm which is less than that of MgO. An interplanar spacing of the $Be_{0.19}Mg_{0.81}O$ layer is reduced because an interplanar spacing of rocksalt BeO is less than an interplanar spacing of rocksalt MgO, and this means that BeO and MgO are chemically bonded to form a rocksalt solid solution. Referring to FIG. 8, crystallization to a rocksalt structure is not clearly shown in the $Be_{0.52}Mg_{0.48O}$ layer. Referring to FIG. 9, it is shown that the pure BeO layer has a (002) average interplanar spacing of 0.2183 nm corresponding to a wurtzite structure other than a rocksalt structure. This means that the pure BeO layer is crystallized to a wurtzite structure.

Figure 10:
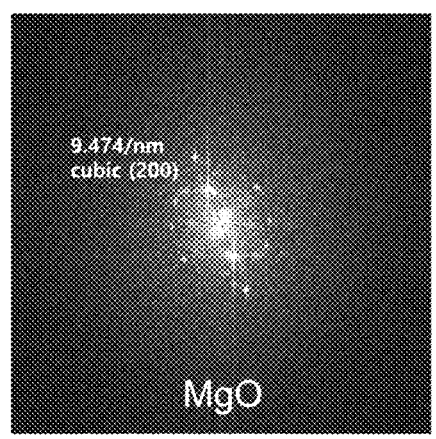
FIGS. 10 to 13 are selected area diffraction pattern (SADP) images of rectangular regions of the HRTEM images of the MgO, $Be_{0.19}Mg_{0.81}O$, $Be_{0.52}Mg_{0.48}O$, and BeO layers of FIGS. 6 to 9.
Figure 11:
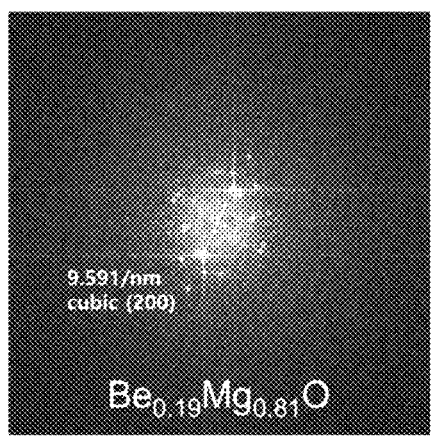
Figure 12:
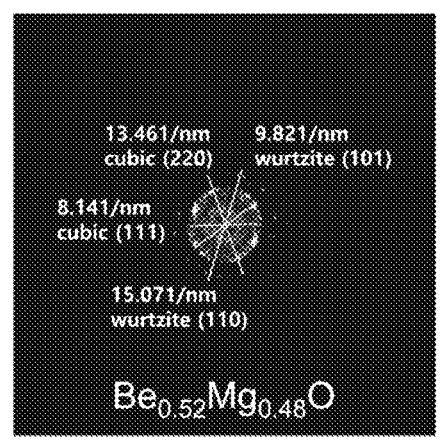
Figure 13:
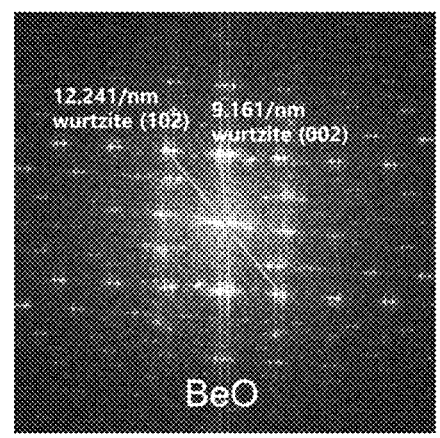

FIGS. 10 to 13 are selected area diffraction pattern (SADP) images of rectangular regions of the HRTEM images of FIGS. 6 to 9. Points corresponding to rocksalt structures and wurtzite structures based on layer composition ratios are observed on the SADP images. Referring to FIGS. 10 and 11, the SADP images of the MgO and $Be_{0.19}Mg_{0.81}O$ layers show rocksalt structures. On the other hand, referring to FIG. 12, the SADP image of the $Be_{0.52}Mg_{0.48}O$ shows a mixture of points corresponding to rocksalt MgO and points corresponding to wurtzite BeO. This means that phase separation into rocksalt MgO and wurtzite BeO occurs in the $Be_{0.52}Mg_{0.48}O$ layer. Referring to FIG. 13, the SADP image of the pure BeO layer shows points corresponding to a single phase of wurtzite.

Referring to the results of FIGS. 3, and 6 to 13, it is shown that a dielectric layer according to an embodiment of the present invention is made of a compound having a chemical formula of $Be_xMg_{1-x}O$ and has a rocksalt structure without a wurtzite structure in a room temperature stable phase when x has a value greater than 0 and less than 0.5.

Figure 14:
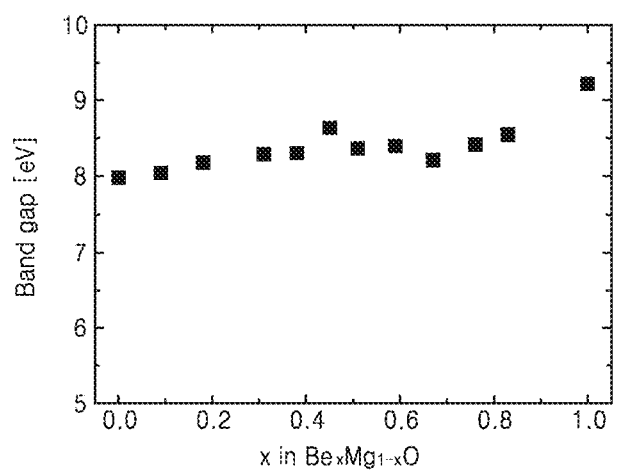
FIG. 14 is a graph showing variations in a band gap based on a composition ratio of a $Be_xMg_{1-x}O$ layer generated by performing an ALD process of a method of manufacturing a dielectric layer, according to test examples of the present invention.

FIG. 14 and Table 3 are a graph and a table showing variations in a band gap based on a composition ratio of a $Be_xMg_{1-x}O$ layer used as a dielectric layer, according to test examples of the present invention.

TABLE 3

| x in $Be_xMg_{1-x}O$ | Band gap (eV) |
|---|---|
| 0 | 7.978 |
| 0.1 | 8.041 |
| 0.19 | 8.179 |
| 0.32 | 8.292 |
| 0.38 | 8.302 |
| 0.46 | 8.638 |
| 0.52 | 8.363 |
| 0.59 | 8.3919 |
| 0.67 | 8.2124 |
| 0.76 | 8.4147 |
| 0.83 | 8.548 |
| 1 | 9.2124 |

Very large band gaps (>8 eV) are shown in an entire range of the composition ratio and the band gap increases in proportion to a composition ratio of BeO. It is known that MgO has a band gap of about 7.8 eV and BeO has a band gap equal to or larger than 10 eV. The band gap of $Be_xMg_{1-x}O$ is remarkably larger than those of next-generation dielectric materials such as titanium oxide ($TiO_2$) (3 eV) and strontium titanate ($SrTiO_3$) (3 eV), and is much larger than those of currently commonly used materials such as zirconium oxide ($ZrO_2$) (5.8 eV) and hafnium oxide ($HfO_2$) (5.3 eV to 5.7 eV). In addition, the band gap of $Be_xMg_{1-x}O$ is larger than those of representative large-band-gap materials such as silicon oxide ($SiO_2$) (9 eV) and amorphous aluminum oxide ($Al_2O_3$) (7.5 eV). As such, it is shown that $Be_xMg_{1-x}O$ is a material capable of easily suppressing a leakage current and reducing a layer thickness.

Figure 15:
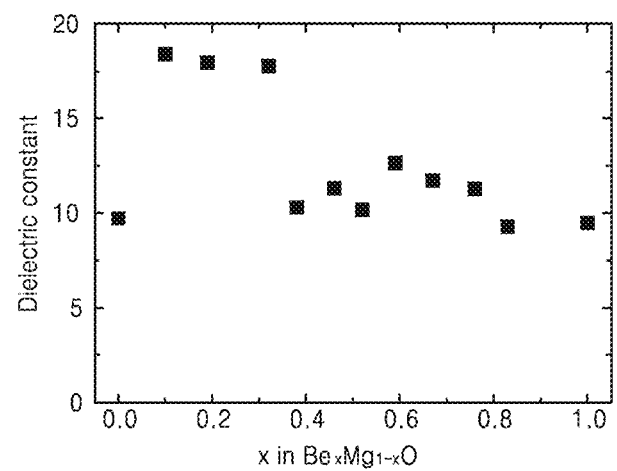
FIG. 15 is a graph showing variations in a dielectric constant based on a composition ratio of a $Be_xMg_{1-x}O$ layer generated by performing an ALD process of a method of manufacturing a dielectric layer, according to test examples of the present invention.

FIG. 15 and Table 4 are a graph and a table showing variations in a dielectric constant based on a composition ratio of a $Be_xMg_{1-x}O$ layer, according to test examples of the present invention.

TABLE 4

| x in $Be_xMg_{1-x}O$ | Dielectric Constant |
|---|---|
| 0 | 9.723 |
| 0.1 | 18.40925 |
| 0.19 | 17.96076 |
| 0.32 | 17.7717 |
| 0.38 | 10.29567 |
| 0.46 | 11.32174 |
| 0.52 | 10.17506 |
| 0.59 | 12.64091 |
| 0.67 | 11.70892 |
| 0.76 | 11.27718 |

TABLE 4-continued

| x in $Be_xMg_{1-x}O$ | Dielectric Constant |
|---|---|
| 0.83 | 9.28745 |
| 1 | 9.4849 |

It is shown that the dielectric constant in a composition ratio range of x=0.1 to 0.32 in $Be_xMg_{1-x}O$ is about two times that of the other composition ratio range. Single layers of BeO and MgO have a dielectric constant equal to or lower than 10 and the increase in the dielectric constant may not be expected by simply mixing the two materials and may be achieved as a result of a change of a crystal structure of the $Be_xMg_{1-x}O$ layer to a rocksalt structure in the composition ratio range. When a composition ratio of BeO is further increased (BeO>60 at. %), since phase separation into rocksalt MgO and wurtzite BeO occurs as shown in FIGS. 6 to 9, and 10 to 13, the effect of increasing the dielectric constant by controlling BeO to a rocksalt structure in the layer disappears.

Referring to the results of FIG. 15, it is shown that a dielectric layer according to an embodiment of the present invention is made of a compound having a chemical formula of $Be_xMg_{1-x}O$ and has a very large band gap (>8 eV) and a high dielectric constant (>17) when x has a value equal to or greater than 0.1 and equal to or less than 0.32.

As described above, according to various embodiments of the present invention, a dielectric layer having a high dielectric constant and a large band gap, a semiconductor memory device including the dielectric layer, and methods of manufacturing the dielectric layer and the semiconductor memory device may be developed and, ultimately, a 10-nm-level DRAM device may be produced. However, the scope of the present invention is not limited to the above effects.

While the present invention has been particularly shown and described with reference to embodiments thereof, it will be understood by one of ordinary skill in the art that various changes in form and details may be made therein without departing from the spirit and scope of the present invention as defined by the following claims.

What is claimed is:

1. A dielectric layer having a rocksalt structure in a room temperature stable phase and made of a compound having a chemical formula as shown below:

$$Be_xM_{1-x}O,$$

where M comprises an alkaline earth metal and x has a value greater than 0 and not greater than 0.19 wherein the dielectric layer is without a wurtzite structure.

2. The dielectric layer of claim 1, wherein M comprises a material selected from the group consisting of magnesium (Mg), calcium (Ca), strontium (Sr), and barium (Ba).

3. The dielectric layer of claim 1, wherein M comprises an alkaline earth metal, an oxide of which has a rocksalt structure in a room temperature stable phase.

4. The dielectric layer of claim 1, wherein the dielectric layer comprises a compound of beryllium oxide (BeO) and an alkaline earth metal oxide that form a rocksalt solid solution without phase separation therebetween.

5. The dielectric layer of claim 1, wherein the dielectric layer is a capacitor dielectric layer of a semiconductor memory device.

6. The dielectric layer of claim 1, wherein the compound provides a dielectric constant of at least 17.9.

7. A semiconductor memory device, comprising:
a capacitor that comprises:
a lower electrode;
a dielectric layer disposed on the lower electrode; and
an upper electrode disposed on the dielectric layer,
wherein the dielectric layer has a rocksalt structure in a room temperature stable phase and is made of a compound having a chemical formula shown below, $$Be_xM_{1-x}O,$$

where M comprises an alkaline earth metal and x has a value greater than 0 and not greater than 0.19 and wherein the dielectric layer is without a wurtzite structure.

8. The semiconductor memory device of claim 7, wherein M is selected from the group consisting of magnesium (Mg), calcium (Ca), strontium (Sr), and barium (Ba).

9. The semiconductor memory device of claim 7, wherein M comprises an alkaline earth metal, an oxide of which has a rocksalt structure in a room temperature stable phase.

10. The semiconductor memory device of claim 7, wherein the dielectric layer comprises a compound of beryllium oxide (BeO) and an alkaline earth metal oxide that form a rocksalt solid solution without phase separation therebetween.

11. The semiconductor memory device of claim 7, wherein the lower electrode comprises a material selected from the group consisting of titanium nitride (TiN), tantalum nitride (TaN), ruthenium (Ru), platinum (Pt), gold (Au), silver (Ag), aluminum (Al), rhodium (Rh), molybdenum (Mo), palladium (Pd), cobalt (Co), copper (Cu), iridium (Ir), tin oxide ($SnO_2$), ruthenium oxide ($RuO_2$), iridium oxide ($IrO_2$), molybdenum oxide ($MoO_2$), and strontium ruthenate ($SrRuO_3$).

12. The semiconductor memory device of claim 7, wherein the compound provides a dielectric constant of at least 17.9.

* * * * *

UNITED STATES PATENT AND TRADEMARK OFFICE
CERTIFICATE OF CORRECTION

| | | Page 1 of 1 |
|---|---|---|
| PATENT NO. | : 11,417,516 B2 | |
| APPLICATION NO. | : 16/225432 | |
| DATED | : August 16, 2022 | |
| INVENTOR(S) | : Seong Keun Kim et al. | |

It is certified that error appears in the above-identified patent and that said Letters Patent is hereby corrected as shown below:

On the Title Page

Item (71) (Applicants)
Please correct the Applicant name as following:
-- Korea Institute of Science and Technology --

Signed and Sealed this
Twenty-fourth Day of January, 2023

Katherine Kelly Vidal
*Director of the United States Patent and Trademark Office*